United States Patent [19]
Saito

[11] Patent Number: 5,464,789
[45] Date of Patent: Nov. 7, 1995

[54] METHOD OF MANUFACTURING A CMOS SEMICONDUCTOR DEVICE

[75] Inventor: Yasuyuki Saito, Yokohama, Japan

[73] Assignee: Kabushiki Kaisha Toshiba, Kawasaki, Japan

[21] Appl. No.: 95,995

[22] Filed: Jul. 23, 1993

Related U.S. Application Data

[63] Continuation of Ser. No. 533,867, Jun. 6, 1990, abandoned.

[30] Foreign Application Priority Data

Jun. 8, 1989 [JP] Japan ................................. 1-145641

[51] Int. Cl.⁶ ........................................... H01L 21/76
[52] U.S. Cl. ..................... 437/57; 437/29; 437/34; 437/46
[58] Field of Search ........................ 437/29, 34, 46, 437/57

[56] References Cited

U.S. PATENT DOCUMENTS

| | | | |
|---|---|---|---|
| 3,793,090 | 2/1974 | Barile et al. | 148/33.3 |
| 4,584,026 | 4/1986 | Wu et al. | 437/46 |
| 4,617,066 | 10/1986 | Vasudev | 148/1.5 |
| 4,703,552 | 11/1987 | Baldi et al. | 437/57 |
| 4,728,391 | 3/1988 | Lesk | 156/649 |
| 4,745,079 | 5/1988 | Pfiester | 437/29 |
| 4,782,033 | 11/1988 | Giersch et al. | 437/56 |
| 4,833,097 | 5/1989 | Butler et al. | 437/29 |
| 4,904,611 | 2/1990 | Chiang et al. | 437/21 |
| 5,036,019 | 7/1991 | Yamane et al. | 437/57 |

FOREIGN PATENT DOCUMENTS

| | | | |
|---|---|---|---|
| 0187622 | 8/1988 | Japan | 437/22 |
| 0299328 | 12/1988 | Japan | . |
| 1216572 | 8/1989 | Japan | . |

OTHER PUBLICATIONS

Wolf, S., *Silicon Processing for the VLSI era vol. 1: Process Technology*, Lattice Press Calif., 1986, pp. 321–325.
Ghandi, S., *VLSI Fabrication Principles Silicon and Gallium Arsenide*, ©1983, pp. 353–354.
U. Schwalke et al., *Journal of Vacuum Science and Technology*, vol. 7, No. 1, Jan./Feb. 1989, pp. 120–126.
J. Y.–C. Sun et al., *IEEE*, 1986, CH2381-2/86/0000-0236, IEDM 86, pp. 236–239, 1986.
Chow, T., P., "Plasma Etching of Refractory Gates For USSI Applications", *Journal of the Electrochemical Society*, Oct. 1984 pp. 2325–2335.

*Primary Examiner*—George Fourson
*Attorney, Agent, or Firm*—Foley & Lardner

[57] ABSTRACT

An improved method of manufacturing a semiconductor device, especially suitable for a p-channel MOS transistor is disclosed. The method includes the steps of forming a gate oxide film over the surface of a semiconductor substrate in a region where a p-channel MOS transistor is to be formed, forming a polysilicon film over the gate oxide film, in order to construct a gate electrode, forming a film of an amorphous material over the polysilicon film and implanting ions of a p-type impurity, especially elemental boron atoms, into the polysilicon film, through the film of amorphous material.

2 Claims, 11 Drawing Sheets

METHOD OF MANUFACTURING A CMOS SEMICONDUCTOR DEVICE

This application is a continuation of application Ser. No. 07/533,867, filed Jun. 6, 1990, now abandoned.

BACKGROUND OF THE INVENTION

The present invention relates to a method of manufacturing a semiconductor device and, more particularly, to a method suitable for manufacturing a p-channel MOS transistor.

To reduce signal propagation delay times in the gate of an n-channel MOS transistor, a low-resistance refractory metal such as tungsten, or a silicide of such a metal, is often used in the gate. However, since there is a problem concerning the interface between such materials and a gate oxide layer formed of silicon oxide, it is common to form the gate of a multi-layer structure comprising a polysilicon film formed over the gate oxide film, and a thin film of the refractory metal, or the silicide of the metal, formed over the polysilicon film. In this case, an n-type impurity is usually added to the polysilicon film by a $POCl_3$ diffusion method, to make the film electrically conductive.

To satisfy recent demands for higher levels of integration, higher operating speeds, and lower power dissipations, there is a trend toward using complementary MOS transistors instead of n-channel MOS transistors alone. As is well known, complementary transistors consist of a pair of an n-channel MOS transistor and a p-channel MOS transistor. For the gate electrodes of both the n-channel MOS transistor and the p-channel MOS transistor, it is common practice to use a polysilicon film to which an n-type impurity has been diffused, between a gate oxide film and a thin film of a refractory metal or a silicide of a refractory metal.

Figure 1:
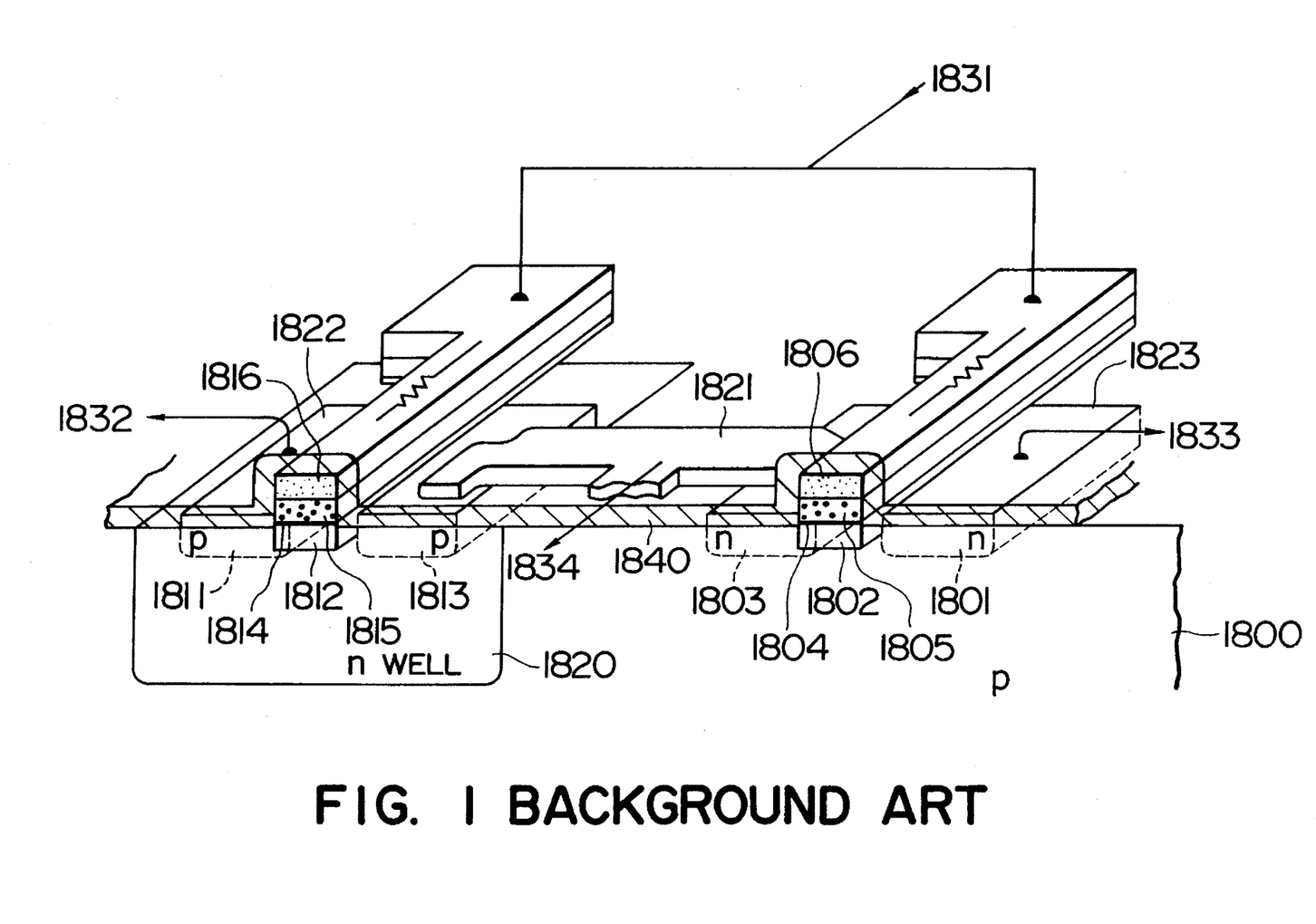
FIG. 1 is a cross-section through the elements of a semiconductor device constructed according to a conventional method.

A cross-section through an element of this structure is shown in FIG. 1. This figure shows the structure of a CMOS inverter circuit in which an n-type impurity layer 1801 acting as the source region of an n-channel MOS transistor and an n-type impurity layer 1803 acting as a drain region of the same transistor are formed in the surface of a p-type semiconductor substrate 1800, with a channel portion 1802 therebetween. In addition, a p-type impurity layer 1811 acting as the source region of a p-channel MOS transistor and a p-type impurity layer 1813 acting as the drain region of the same transistor are formed in an n-well 1820, with a p-channel portion 1812 therebetween. An inter-layer insulating film 1840 is formed over the semiconductor substrate 1800. To provide a gate electrode for the n-channel MOS transistor, a polysilicon film 1805 is formed on a gate oxide film 1804, and a metal silicide film 1806 is formed on the polysilicon film 1805. In the same way, to provide a gate electrode for the p-channel MOS transistor, a gate oxide film 1814, a polysilicon film 1815, and a metal silicide film 1816 are formed in sequence. The two polysilicon films 1805 and 1815 are implanted with a high dosage of at least $10^{21}$ atoms/cm$^3$ of, for example, arsenic, as an n-type impurity. The p-type impurity layer 1811 (1822) (source) is connected to a power source (not shown in the figure) by an interconnection/electrode 1832 made of a material such as aluminum, and an n-type impurity layer 1823 (source) is connected to the power source by an interconnection/electrode 1833. The n-type impurity layer 1803 (drain) of the n-channel MOS transistor and the p-type impurity layer 1813 (drain) of the p-channel MOS transistor are connected together by wiring 1821 that transfers an inverter output 1834 to an external device (not shown in the figure). Inverter inputs come from an interconnection 1831 are supplied to the metal silicide film 1806 and the polysilicon film 1805 acting as the gate electrode of the n-channel MOS transistor and the metal silicide film 1816 and the polysilicon film 1815 acting as the gate electrode of the p-channel MOS transistor.

In order to improve the I/O characteristics and operating speeds of this CMOS inverter, it is necessary to control the threshold voltages of the n-channel and p-channel MOS transistors to a high degree of accuracy. Some of the phenomena that affect threshold voltages are the work functions of the materials of the gate electrode and the thickness of its oxide film, the profile of the impurity layer, and the interface charge. To increase operating speeds, it is best to have a threshold voltage close to zero. But to allow room for noise detection, it is preferable to have a threshold voltage that is far from zero. Therefore, it is common practice to treat the threshold voltages of the two transistors as a pair and, for example, set the threshold voltage of the n-channel MOS transistor to approximately 0.8 V, and that of the p-channel MOS transistor to approximately −0.8 V. However, as elements get smaller, the distances between the source and drain become shorter, making punch-through current more likely to occur, so the construction described below has become necessary.

Figure 2:
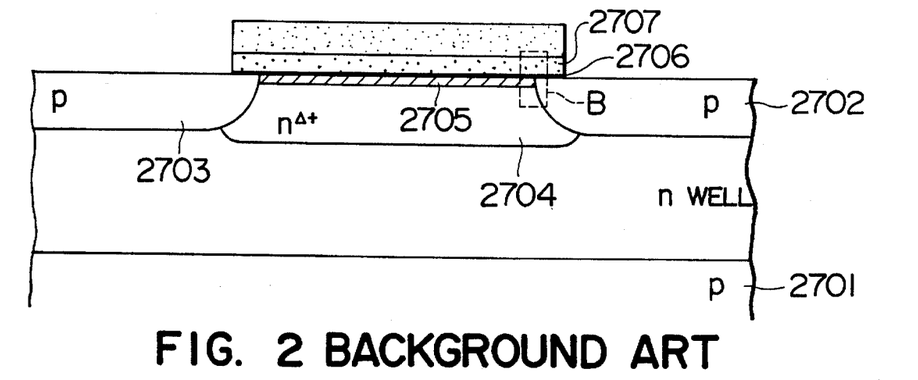
FIG. 2 is an enlarged cross-section of the channel region below the gate electrode of the p-channel MOS transistor of the device shown in FIG. 1.

As shown in the cross-section through the structure of a p-channel MOS transistor in FIG. 2, a high-concentration, n-type punch-through current suppression layer 2704 is formed in a channel region between p-type impurity layers 2703 and 2702.

Figure 3:
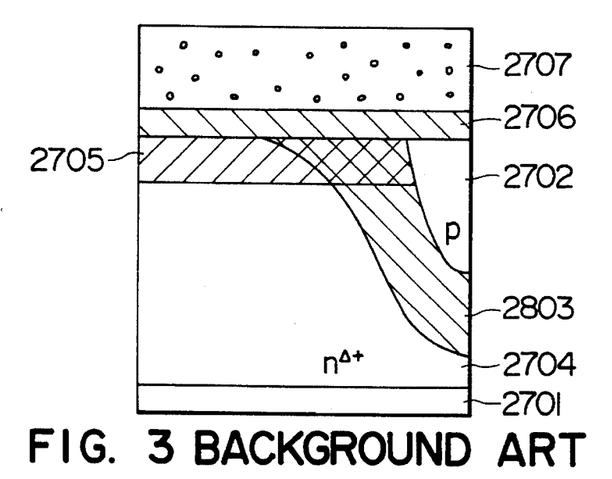
FIG. 3 is an enlarged cross-section of the part enclosed by the box B in FIG. 2.
Figure 4:
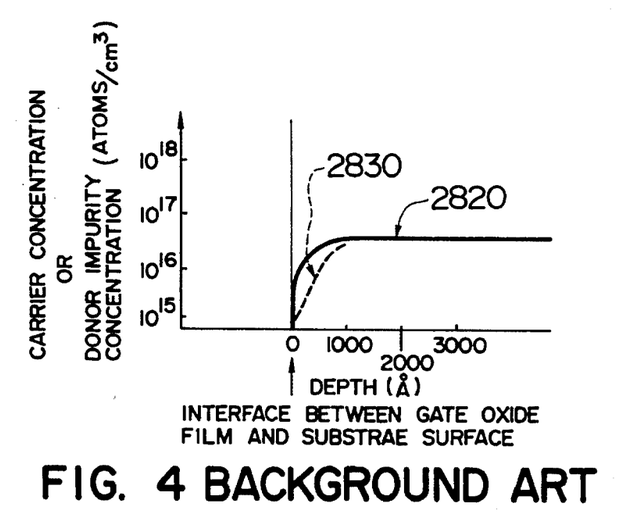
FIG. 4 is a graph of impurity concentration in the depth-wise direction of the part enclosed by the box B.

In an n-channel MOS transistor, there would be no bad effect if an n-type impurity were implanted into a polysilicon film 2707 that forms a gate electrode. However, if an n-type impurity is implanted into such a polysilicon film 2707 of the p-channel MOS transistor, the work function of the gate electrode of the p-channel structure will become greater than in the case when a p-type impurity is implanted, and the threshold voltage will move further away from zero from −0.8 V (for p-type impurity implanted polysilicon) to, for instance, −2.0 V, hindering any increase in operating speed. To prevent this, a p-type impurity must be implanted as a counter-dose into the region below a gate oxide film 2706, reducing the concentration of n-type impurity in this portion. To illustrate what happens in this case, the portion enclosed in the box B in FIG. 2 is enlarged in FIG. 3, and the variation of impurity concentration in the depthwise direction is shown in FIG. 4. As shown in FIG. 3, a carrier depletion layer 2803 is generated between the n-type punch-through current suppression layer 2704 and the p-type impurity layer 2702, and an n-type low-concentration counter-dose region 2705 is formed below the gate oxide film 2706. This reduces the impurity concentration, bringing it closer to the boundary line with the gate oxide film, as shown in FIG. 4 (2830).

Figure 5:
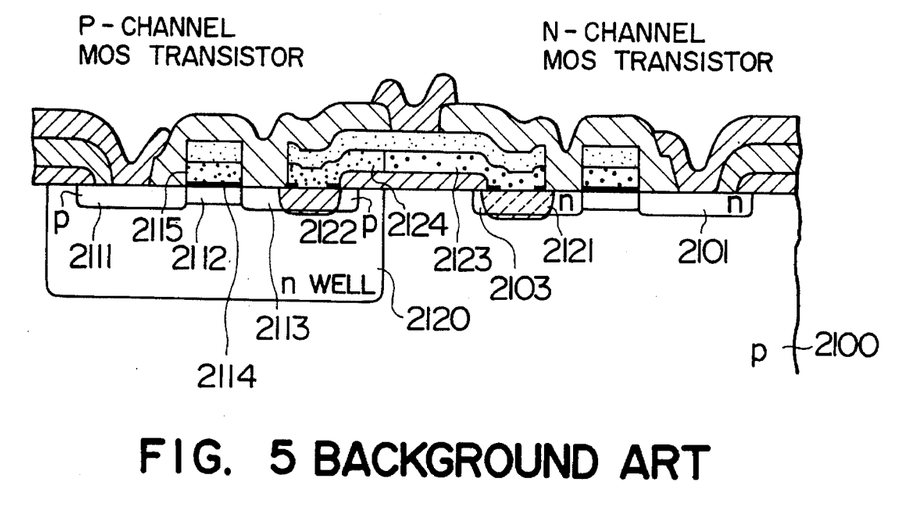
FIG. 5 is a cross-section through the elements of a semiconductor device constructed according to another conventional method.

However, as the impurity concentration decreases in this way, as shown by a reference numeral 2820 in FIG. 4, a punch-through current is more likely to be generated. Thus, there are conflicting demands that the threshold voltage should be both near zero to increase operating speeds, and be large enough to prevent the occurrence of punch-through currents. In order to satisfy both demands, the inventors have proposed (in Japanese No. 1513852) a structure wherein the polysilicon film 2707 of the p-channel MOS transistor is made different from the polysilicon film of the n-channel MOS transistor, by the implantation of a p-type impurity. A cross-section through a device having a polysilicon film of this structure is shown in FIG. 5.

In the same way as the device of FIG. 1, n-type impurity layers 2101 (source) and 2103 (drain) of an n-channel MOS transistor are formed in the surface of a p-type semiconductor substrate 2100, and p-type impurity layers 2111 (source) and 2113 (drain) of a p-channel MOS transistor are formed in an n-well 2120, but this device differs from that of FIG. 1 in that a p-type impurity is implanted into a polysilicon film 2115 that forms part of a gate electrode on the p-channel MOS transistor side. In addition, the n-type impurity layer 2103 of the n-channel MOS transistor and the p-type impurity layer 2113 of the p-channel MOS transistor are connected by a polysilicon layer, but a p-type impurity is implanted on a p-type impurity layer side 2124 thereof, and an n-type impurity is implanted on an n-type impurity layer side 2123 thereof.

With this structure, if a p-type impurity is implanted into the polysilicon film 2115 on the p-channel MOS transistor side, there is no occurrence of the phenomenon described above whereby the implantation of an n-type impurity tends to cause a change in the work function that moves the threshold voltage far away from zero. Therefore, there is no need to reduce the n-type impurity concentration in a counter-dose region below a gate oxide film 2114 that is part of a punch-through current suppression layer 2112 thereof (It is necessary to implant a small amount of impurity in order to control the fine $V_{th}$. This both keeps the threshold voltage close to zero, increases the operating speed, and prevents the generation of a punch-through current.

However, this conventional method of manufacturing a semiconductor device has the problem that the threshold voltage of the p-channel MOS transistor can deviate wildly from its value set at the design stage, making it impossible to control with a high degree of accuracy. The cause of this deviation will now be described with reference to FIG. 6. This figure shows the stage in the manufacture after the gate oxide film 2114 and a polysilicon film that has not yet had any p-type impurity implanted into it are formed on the n-well 2120 formed in the p-type semiconductor substrate 2100, and after an impurity has been added to the punch-through current suppression layer 2112, but before the high-concentration p-type impurity layers 2111 (source, not shown in the figure) and 2113 (drain) have been formed, and before a polysilicon film 2211 has been patterned.

Figure 6:
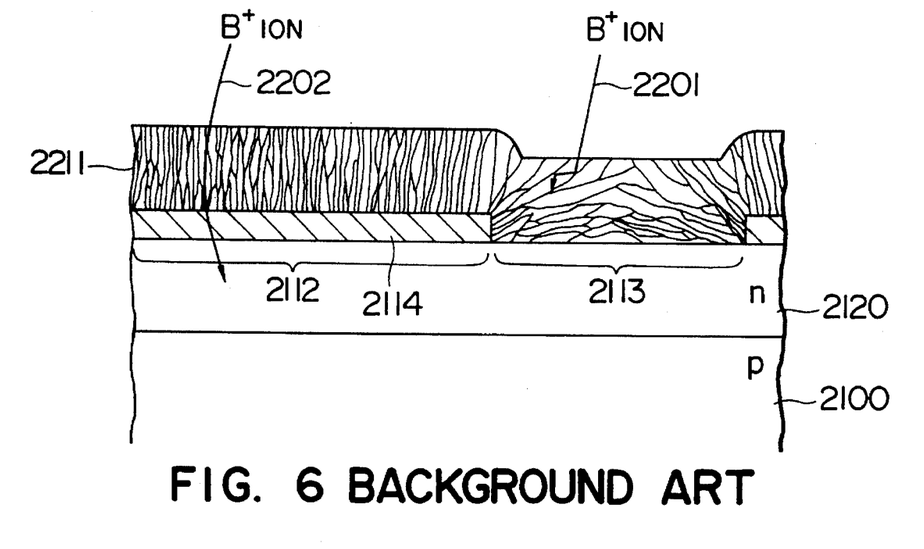
FIG. 6 is a cross-section through the elements of FIG. 5, showing the situation when boron ions are implanted into the polysilicon film.

In this case, assume that elemental boron ions ($B^+$) are the most suitable p-type impurity to be implanted into the polysilicon film 2211. Since the atomic number of boron is 5, the ion implantation obstruction capacity (stopping power) of the polysilicon film 2211 with respect to boron is substantially lower than that for other impurities such as phosphorous (atomic number 15) and arsenic (atomic number 33). Therefore, the accelerating voltage required for implanting the boron ions will inevitably be very small, on the order of, for example, 20 keV. However, since such an accelerating voltage is too small to ensure that the boron ions are drawn stably out of the ion source, it is difficult to control the accelerating voltage in such a way that it is kept small enough that the ions penetrate the polysilicon film 2211 but are not implanted into the channel portions, and that they are implanted to the optimal depth.

One method of solving the problem of the too-small accelerating voltage is to use boron fluoride ($BF_2^+$) ions, which enables implantation at a higher accelerating voltage while reducing the implantation depth to approximately ⅕ of the depth achieved by boron ions. However, since molecular boron fluoride ions tend to separate into more stable forms of boron ions and fluorine ions, in practice, this method causes about the same sort of problem as that of the implantation of boron ions alone. (Refer to 89 IEDM Technical Digest No. 17-1, Frank K. Baker et al. and No. 17-2, J. M. Sung et al.) Therefore, it is difficult to control the implantation depth of the boron ions to such a high degree of accuracy that they stop within the polysilicon film 2211.

Another problem concerns the crystallization of the polysilicon film 2211. As shown in FIG. 6, grains of the polysilicon film above the p-type impurity layer 2113 grow irregularly, but the crystals above the gate oxide film 2114 grow with their axes aligned. As a result, the boron ions stop within the polysilicon film 2211 above the region destined to become the p-type impurity layer 2113, as shown by the arrow 2201, but many of those that penetrate above the gate oxide film 2114 travel as far as a channel region formed by the punch-through current suppression layer 2112, as shown by the arrow 2202, causing one reason for variations in threshold voltage.

SUMMARY OF THE INVENTION

It is, accordingly, an object to solve the abovementioned problems and to provide a method of preventing p-type impurity ions from penetrating into a channel portion below a gate oxide film, when the ions are implanted into the polysilicon film to form a gate electrode of a p-channel MOS transistor. This manufacturing method prevents the threshold voltage from deviating from the value set for it at the design stage, and provides a means of controlling the threshold voltage with a high degree of accuracy.

In accordance with the present invention, there is provided a method of manufacturing a semiconductor device comprising the steps of forming a gate oxide film over the surface of a semiconductor substrate in a region where a p-channel MOS transistor is to be formed; forming a polysilicon film over the gate oxide film, in order to construct a gate electrode; forming a film of an amorphous material over the polysilicon film; and implanting ions of a p-type impurity into the polysilicon film through the film of the amorphous material.

When the p-type impurity ions are being implanted into the polysilicon film, they pass through the film of the amorphous material formed over the polysilicon film. As they strike the film of amorphous material, the direction in which they are moving randomly is refracted thereby, so that when they strike the polysilicon film after passing through the amorphous material film they do not penetrate the polysilicon film and are stopped thereby. They are, thus, prevented from being implanted into the channel portion of the element device. Therefore, the threshold voltage can be kept constant at the value set for it at the design stage.

BRIEF DESCRIPTION OF THE DRAWINGS

In the accompanying drawings.

DESCRIPTION OF THE PREFERRED EMBODIMENTS

Figure 7:
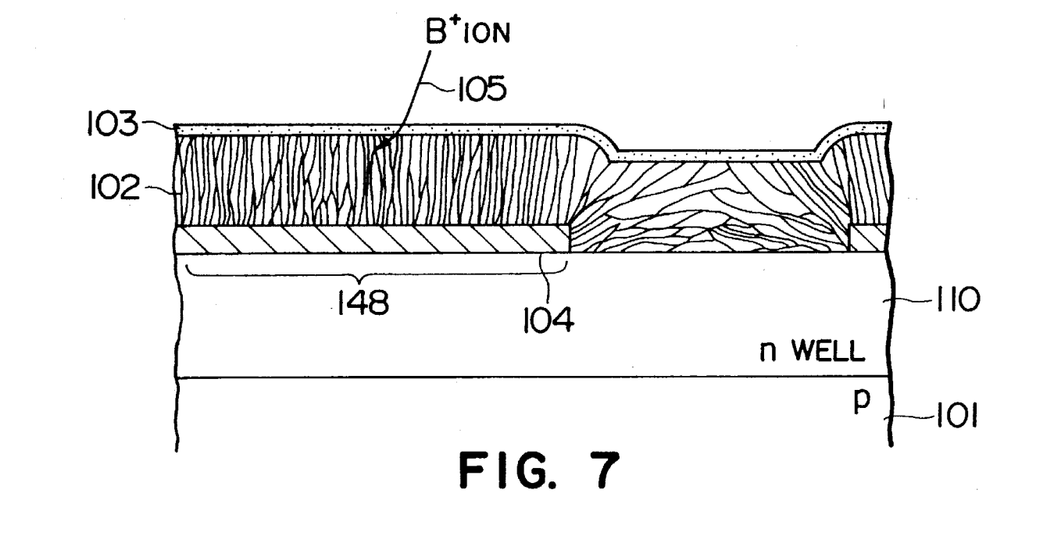
FIG. 7 is a cross-section through elements of a semiconductor device of one embodiment of the present invention, illustrating the concept thereof.

A first embodiment of the present invention will now be described with reference to the accompanying drawings. The basic concept of the method of manufacturing a semiconductor device according to the present invention is shown in FIG. 7. The figure shows the situation after a polysilicon film 102, that has not yet been patterned, is formed on the surface of an n-well 110 formed on a p-type semiconductor substrate 101, and an amorphous (non-crystalline) film 103 is formed on the polysilicon film 102. Any of a wide range of materials can be used for the amorphous film 103, provided it is amorphous. For example, an insulating material such as silicon dioxide ($SiO_2$) or silicon nitride ($Si_3N_4$), or a conducting material that is either a refractory metal such as tungsten, titanium, molybdenum, cobalt, or tantalum, or a silicide of a refractory metal such as tungsten silicide, titanium silicide, molybdenum silicide, cobalt silicide, or tantalum silicide, could be used. When boron ions are implanted through the film 103 made of such an amorphous material, the direction in which the ions move is refracted by the amorphous film 103, as shown by the arrow 105, and they stop within the polysilicon film 102. Therefore, the phenomenon that occurs in the conventional device (shown by the arrow 2202 in FIG. 6) in which boron ions penetrate the polysilicon film and are implanted into the channel portion below the gate oxide film, is prevented.

Therefore, the first method for adding only boron element into the polysilicon film 102, to have a high concentration, has been realized. Using such a method, the polysilicon film having a high hole concentration is suitable for gate electrodes.

The following describe the method of manufacturing a semiconductor device in which the film 103 is designed to prevent any unwanted penetration of boron ions.

Figure 8A:
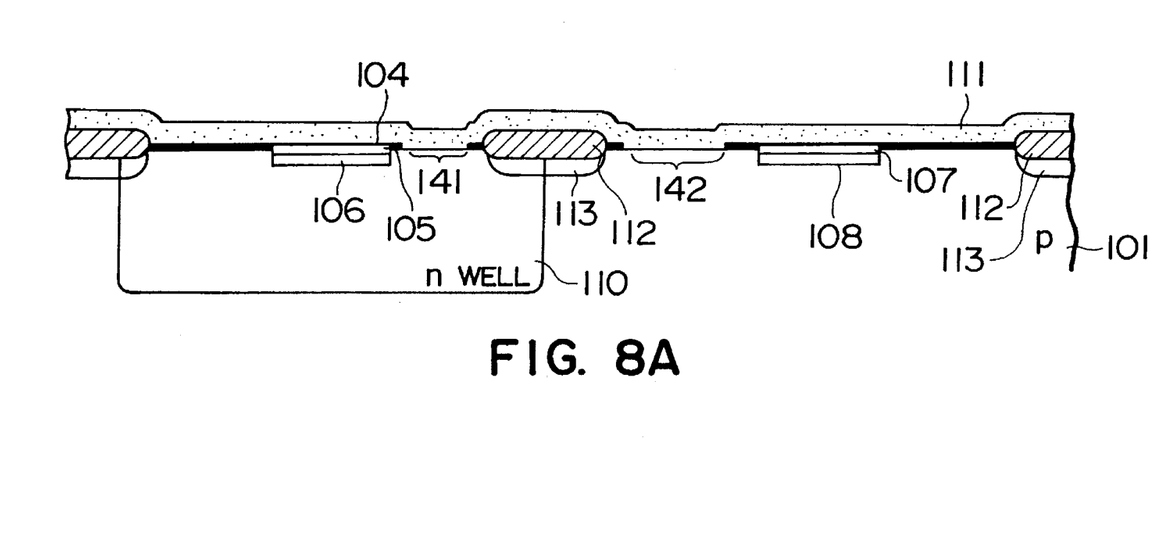
FIGS. 8A to 8L are cross-sections through the elements of the semiconductor device constructed according to the above embodiment of the present invention, illustrating steps in the construction thereof.

First the n-well 110 is formed in the region of the semiconductor substrate 101 that is destined to become the p-channel MOS transistor, then a field oxide film 112 and a field inversion prevention layer 113 are formed between the regions destined to become separate elements (FIG. 8A). Points 141 and 142 are removed from a gate oxide film 104 in connection with the drain region on the p-channel MOS transistor side and the drain region on the n-channel MOS transistor side, to allow electrical conduction with those regions. A punch-through current suppression layer 106 and a counter-dose (for fine control) region 105 are formed under the region destined to form the gate electrode of the p-channel MOS transistor, and a punch-through current suppression layer 108 and a counter-dose (for fine control) region 107 are formed under the region destined to form the gate electrode of the n-channel MOS transistor. The entire surface is then covered with an approximately 1700 Å thick film by a method such as low pressure chemical vapor deposition (LPCVD), to form a polysilicon film 111 to which no impurities have yet been added.

Figure 8B:
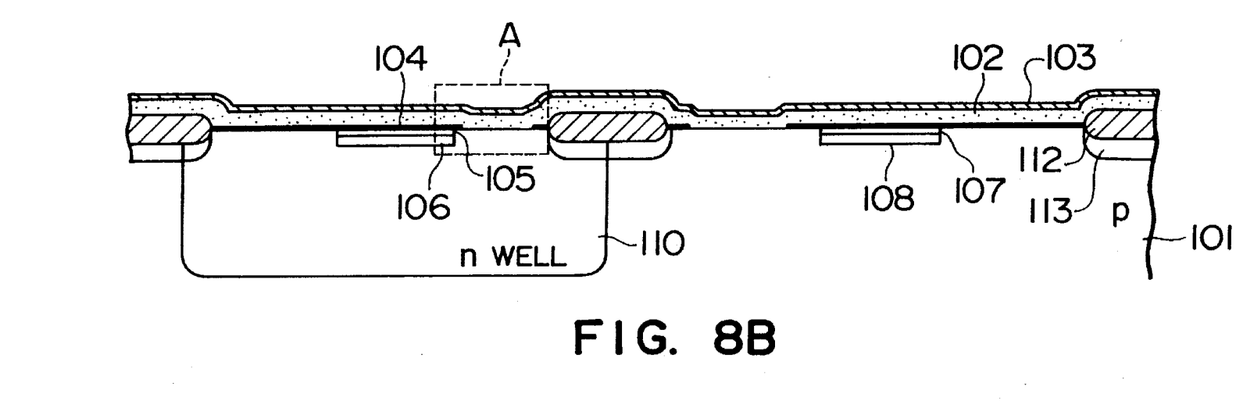
Figure 9:
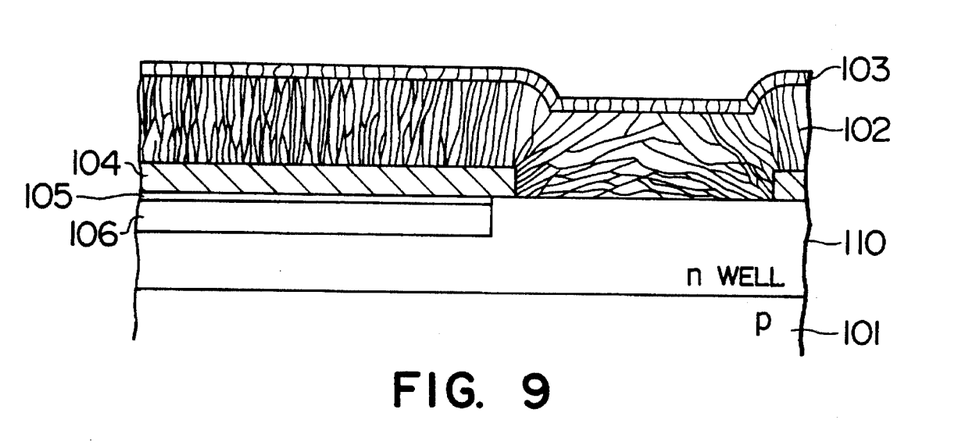
FIGS. 9 and 10 are enlargements of the part enclosed by the box A in FIG. 8.

Next, the above-described amorphous film 103 is formed over the entire surface of the polysilicon film (FIG. 8B). The portion of the device that is destined to become a p-type impurity layer, surrounded by the box A in this figure, is shown enlarged in FIG. 9. As described above, an insulating material such as silicon dioxide ($SiO_2$) or silicon nitride ($Si_3N_4$) can be used as the amorphous film 103 formed on top of the polysilicon film 102. A silicon dioxide film could be formed by CVD of a mixed gas of silane ($SiH_4$) and oxygen ($O_2$) at 1 atmosphere and 400° C., or a silicon nitride film could be formed by plasma CVD of a mixed gas of silane ($SiH_4$) and ammonia ($NH_3$) at 300° C. In addition, the film should be cooled rapidly to ensure that crystallization does not occur. The thickness of the amorphous film is preferably 500 to 1000 Å.

One advantage of using a refractory metal such as tungsten, titanium, or molybdenum, or a silicide of a refractory metal such as tungsten silicide, titanium silicide, or molybdenum silicide, as the conductive material is that it can be formed by a CVD or sputtering method to a thickness of, for example, 200 to 1000 Å.

Figure 10:
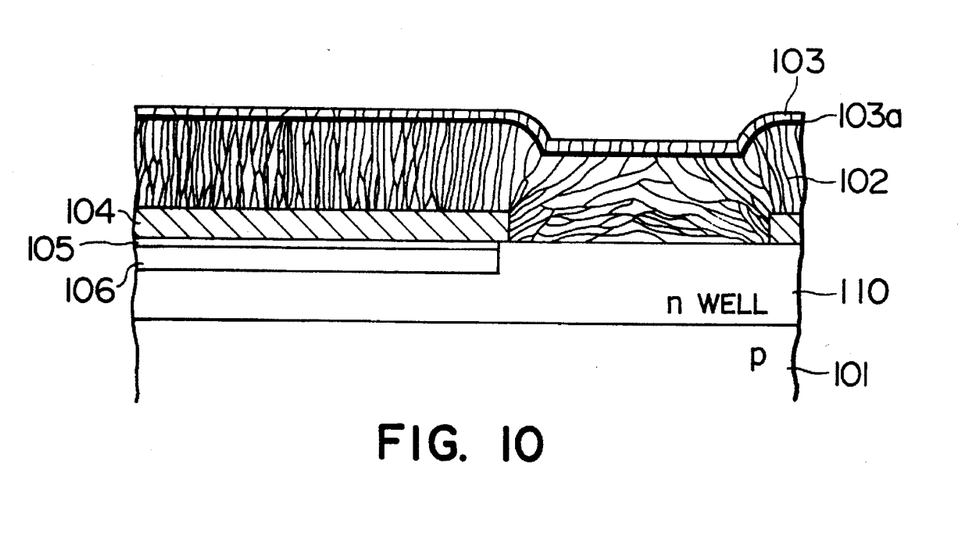

The amorphous film 103 can be formed in one of the above-described ways, but if it is too thin, the internal reactions caused by subsequent high-dosage implantation of boron ions may result in the peeling of the amorphous film 103. Therefore, if the amorphous film 103 is a refractory metal, a method such as rapid thermal annealing could be used at this point to turn a surface 103a thereof in contact with the polysilicon film 102 into the silicide, as shown in FIG. 10, to prevent peeling.

Figure 8C:
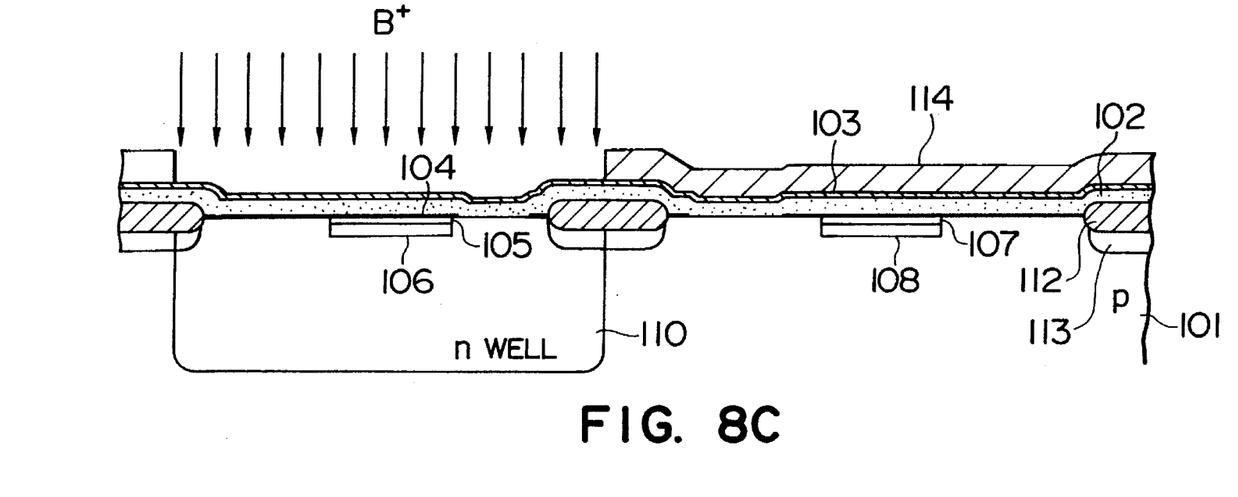
Figure 8D:
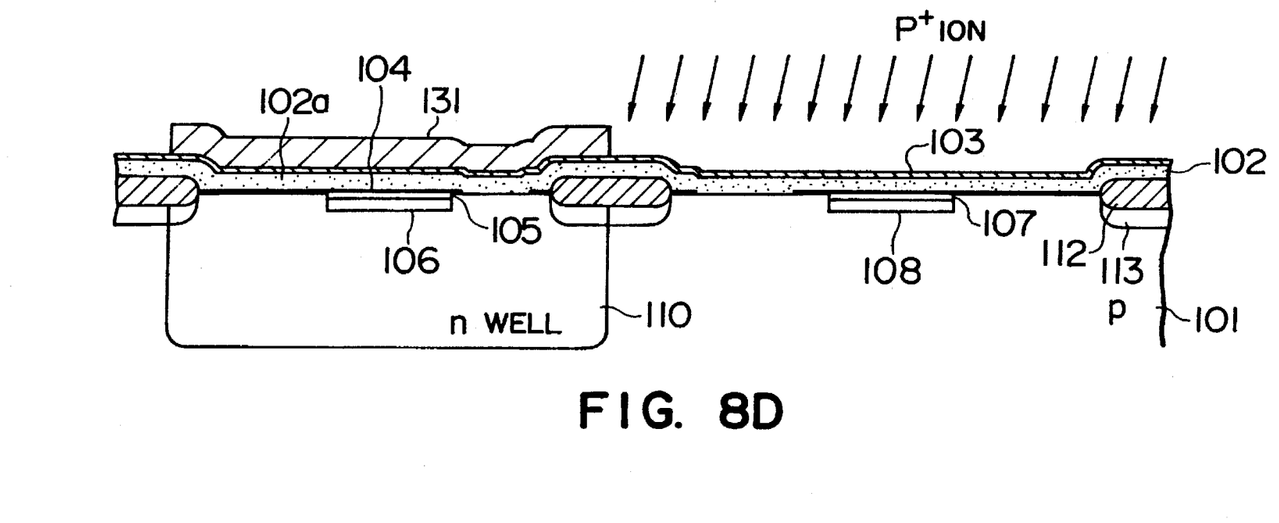

After a resist film 114 is formed over the entire surface of the amorphous film 103, either wet or dry etching is used to remove unwanted portions thereof, leaving portions thereof over the regions destined to become the n-channel MOS transistor and an n-type impurity region, as shown in FIG. 8C. The resist film 114 is then used as a mask for the implantation of boron ions at a dosage of, for example, $5 \times 10^{16}$ atoms/cm$^2$, with an accelerating voltage of 30 keV through the amorphous film 103 into the polysilicon film 102 above the regions destined to become the p-channel MOS transistor and a p-type impurity region. This process results in a polysilicon film 102a into which boron ions have been implanted at a high concentration, as shown in FIG. 8D. In this case, since the boron ions are implanted through the amorphous film 103, they stop within the interior of the polysilicon film 102, and do not penetrate as far as the counter-dose region 105.

The resist film 114 is then peeled off by an asher such as an oxygen plasma, then it is completely removed by processing involving a hot mixture of liquids such as sulfuric acid and hydrogen peroxide. Resist is then applied to the entire surface, and it is patterned to form a resist film 131 that remains above the regions destined to become the p-channel MOS transistor and the p-type impurity region. The resist film 131 is used as a mask for the implantation of phosphorous ions ($P^+$) at a dosage of, for example, $5 \times 10^{16}$ atoms/cm$^2$ with an accelerating voltage of 50 keV through the amorphous film 103 into the polysilicon film 102 above the region destined to become the n-channel MOS transistor. In this case, since a large number of atoms of phosphorous or arsenic are implanted as the n-type impurity, they pass through the amorphous film 103 but are stopped within the polysilicon film 102, so they do not penetrate as far as the counter-dose region 107.

Figure 8E:
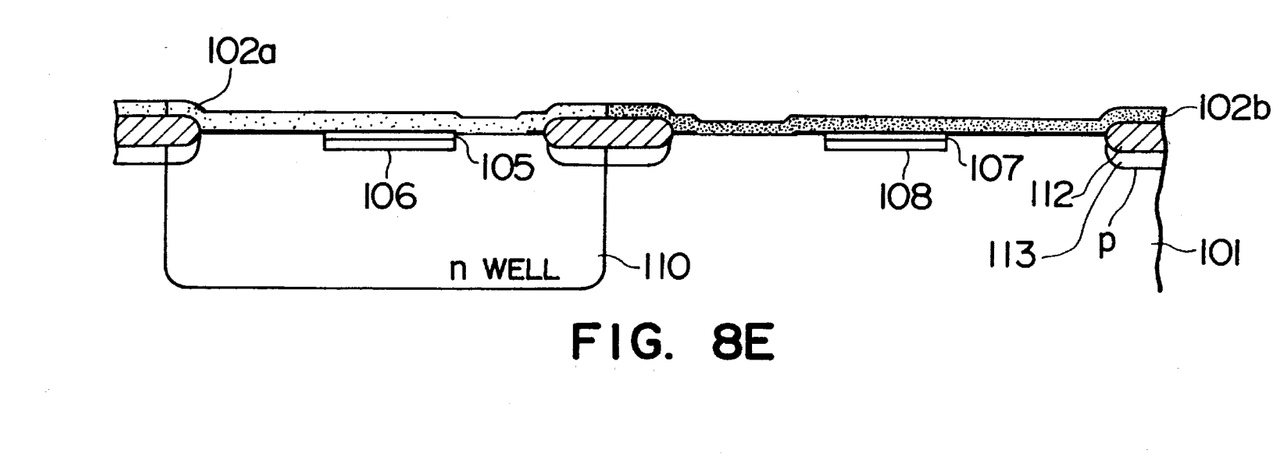

The resist film 131 and the amorphous film 103 are then removed. If the amorphous film 103 is made of an insulating material such as silicon dioxide, it must be removed at this point; but if it is made of a conductive material such as tungsten or tungsten silicide, there is no need to remove it. The processing so far has formed a polysilicon film 102a into which boron ions (p-type impurity ions) have been implanted above the region destined to become the p-channel MOS transistor, and a polysilicon film 102b into which phosphorous ions (n-type impurity ions) have been implanted above the region destined to become the n-channel MOS transistor (FIG. 8E).

Figure 8F:
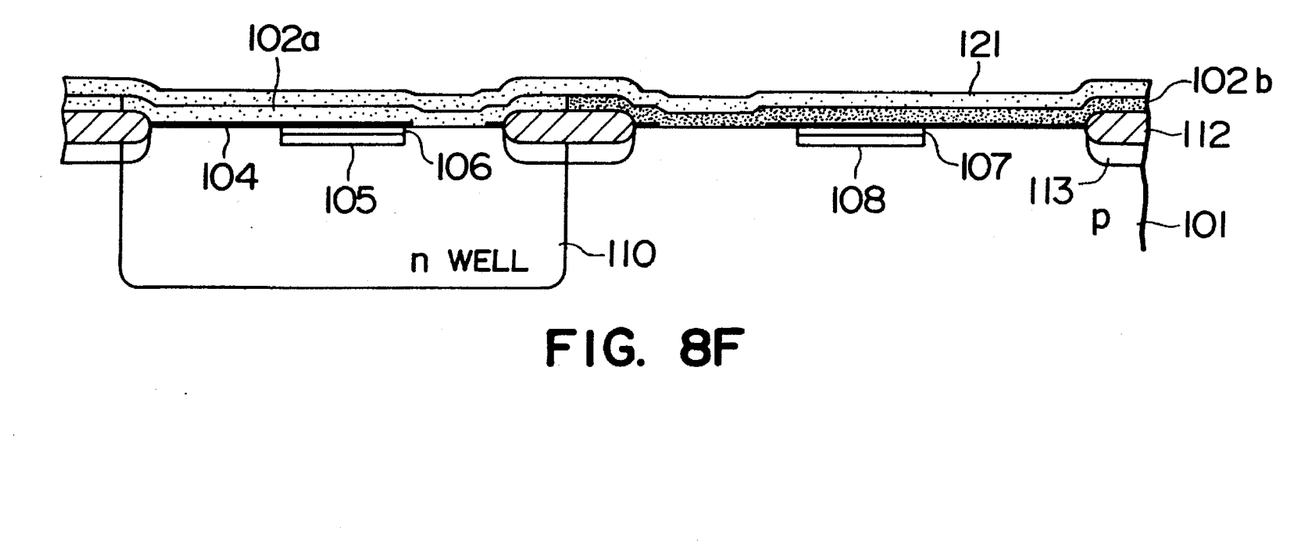

Over the entire surface of the polysilicon films 102a and 102b obtained in this way, a metal silicide film 121 of a silicide of a refractory metal, such as tungsten silicide, is then formed to a thickness of approximately 2500 Å (FIG. 8F).

Figure 8G:
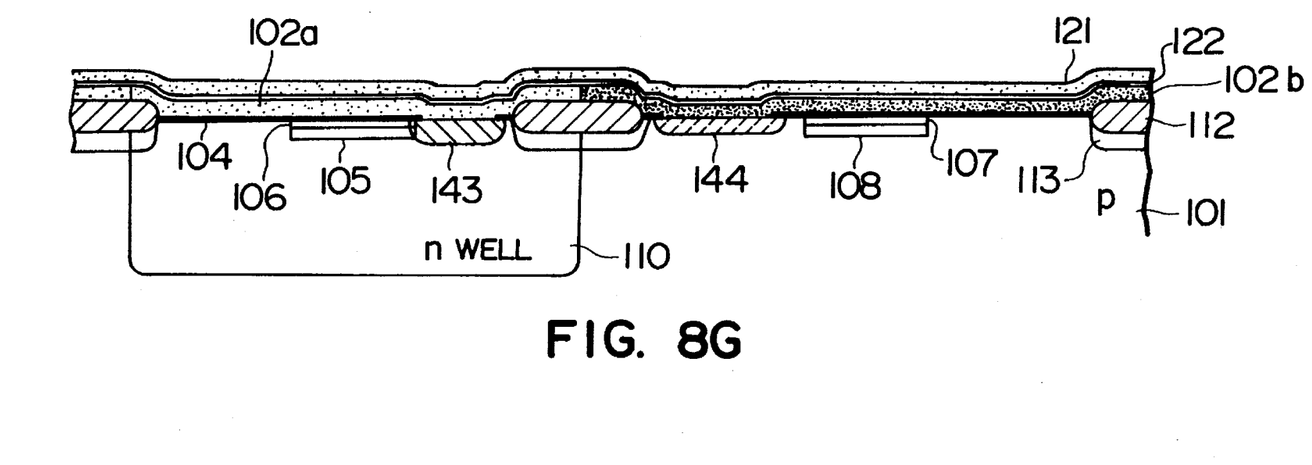

At this stage, a suitable heat treatment temperature cycle could be applied in a diffusion furnace or a rapid thermal furnace in order to adjust the film quality of the metal silicide film 121, but this step is not necessary if its omission would not cause any problems in subsequent steps. The boron and phosphorous impurities are electrically active, so they migrate and disperse from the polysilicon films 102a and 102b, respectively, to form electrically conductive layers 143 and 144. In the same way, at the interface portion between the metal silicide film 121 and the polysilicon films 102a and 102b, an electrically conductive film 122 of a resistance lower than that of polysilicon is formed from the polysilicon and the metal silicide by the migration and dispersion of boron and phosphorous ions (FIG. 8G).

Figure 8H:
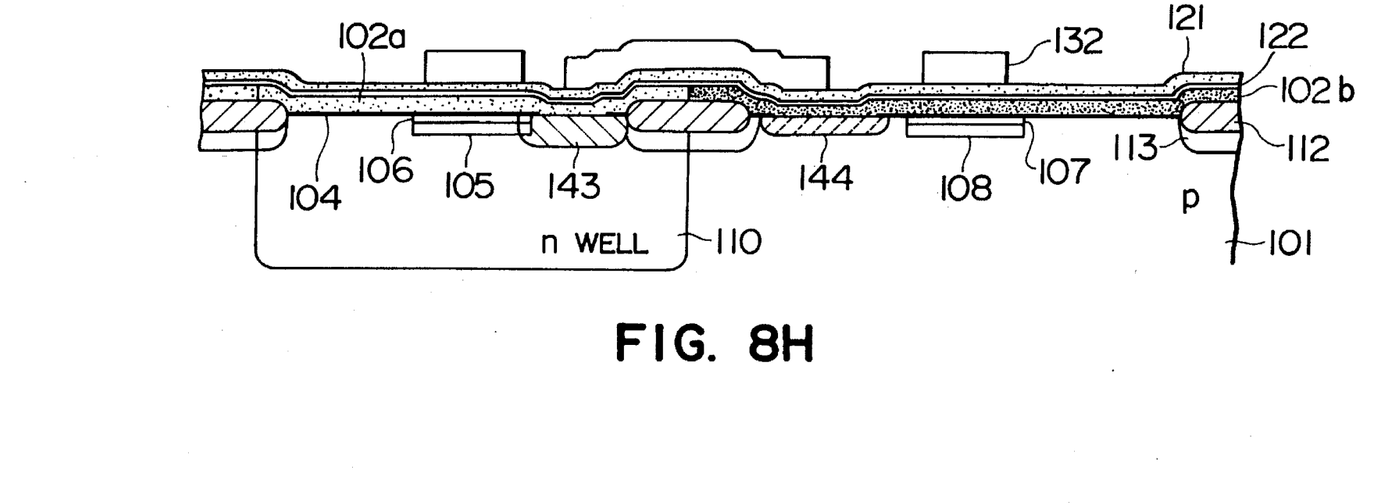
Figure 8I:
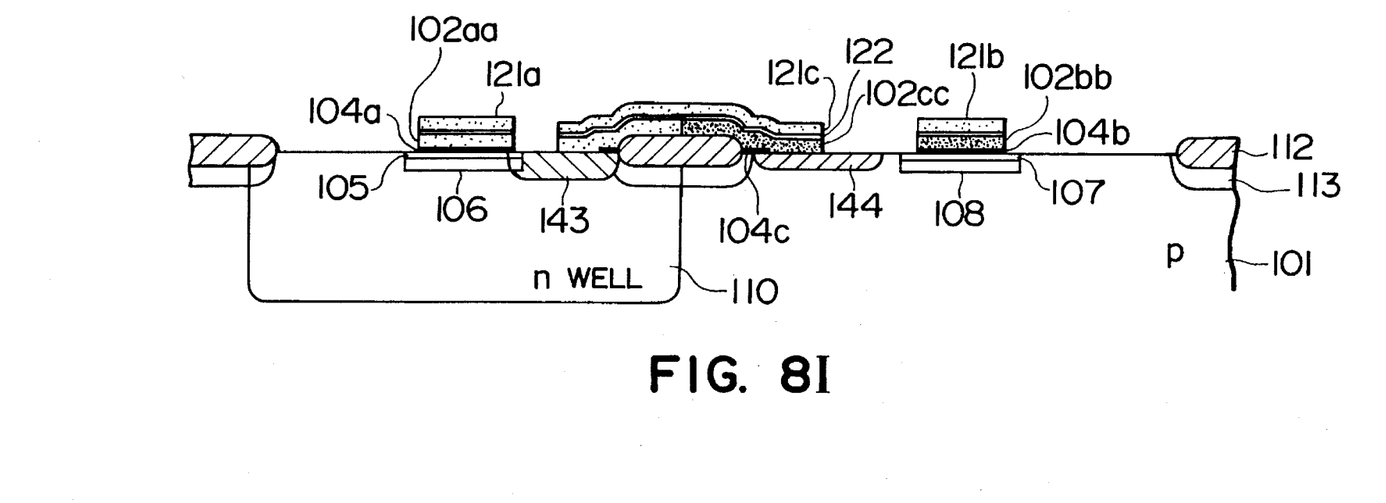

Another layer of resist is then applied and a resist film 132 is formed therefrom by photolithography (FIG. 8H). This resist film 132 is used as a mask for patterning the gate oxide film 104, the polysilicon films 102a and 102b, and the metal silicide film 12, which contains the conductive film 122, by a method such as reactive ion etching (RIE), then the resist film 132 is removed by means such as an asher and hot liquid processing (FIG. 8I). This step results in a gate electrode on the p-channel MOS transistor side formed of a multi-layer structure comprising a gate oxide film 104a, a polysilicon film 102aa, and a metal silicide film 121a; a gate electrode on the n-channel MOS transistor side formed of a multi-layer structure comprising a gate oxide film 104b, a polysilicon film 102bb, and a metal silicide film 121b; and an inverter output electrode formed of a gate oxide film 104c, a polysilicon film 102cc, and a metal silicide film 121c, (which contains the conductive film 122).

Figure 8J:
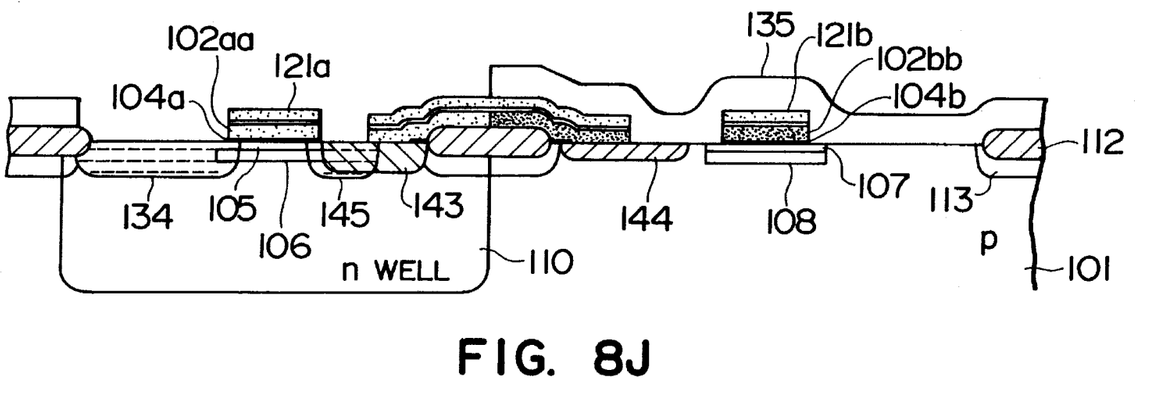
Figure 8K:
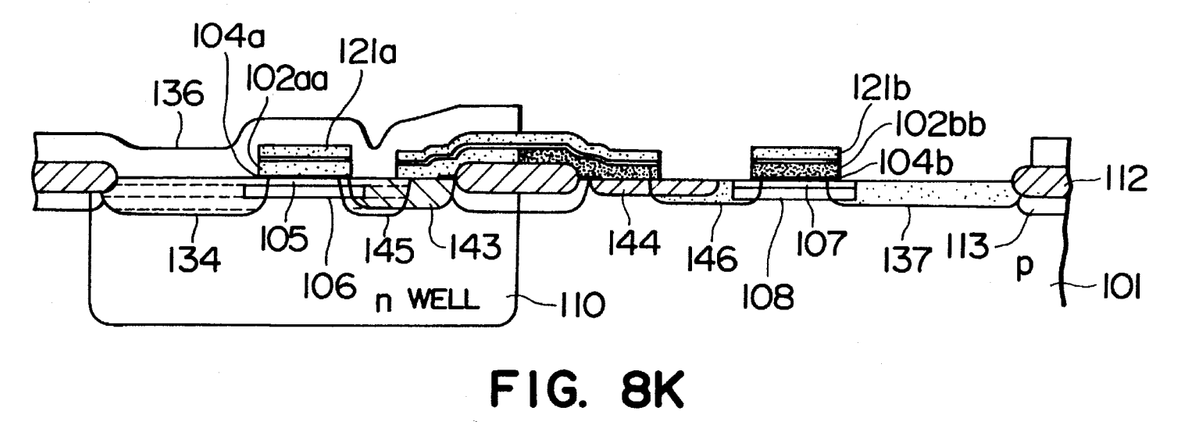

A resist film 135 is then used as a mask for the implantation of boron ions to form a p-type impurity layer 134 to act as a source of the p-channel MOS transistor and a p-type impurity layer 145 to act as a drain of the same transistor (FIG. 8J); and a resist film 136 is used as a mask for the implantation of phosphorous ions to form an n-type impurity layer 137 to act as a source of the n-channel MOS transistor and an n-type impurity layer 146 to act as a drain of the same transistor (FIG. 8K).

Figure 8L:
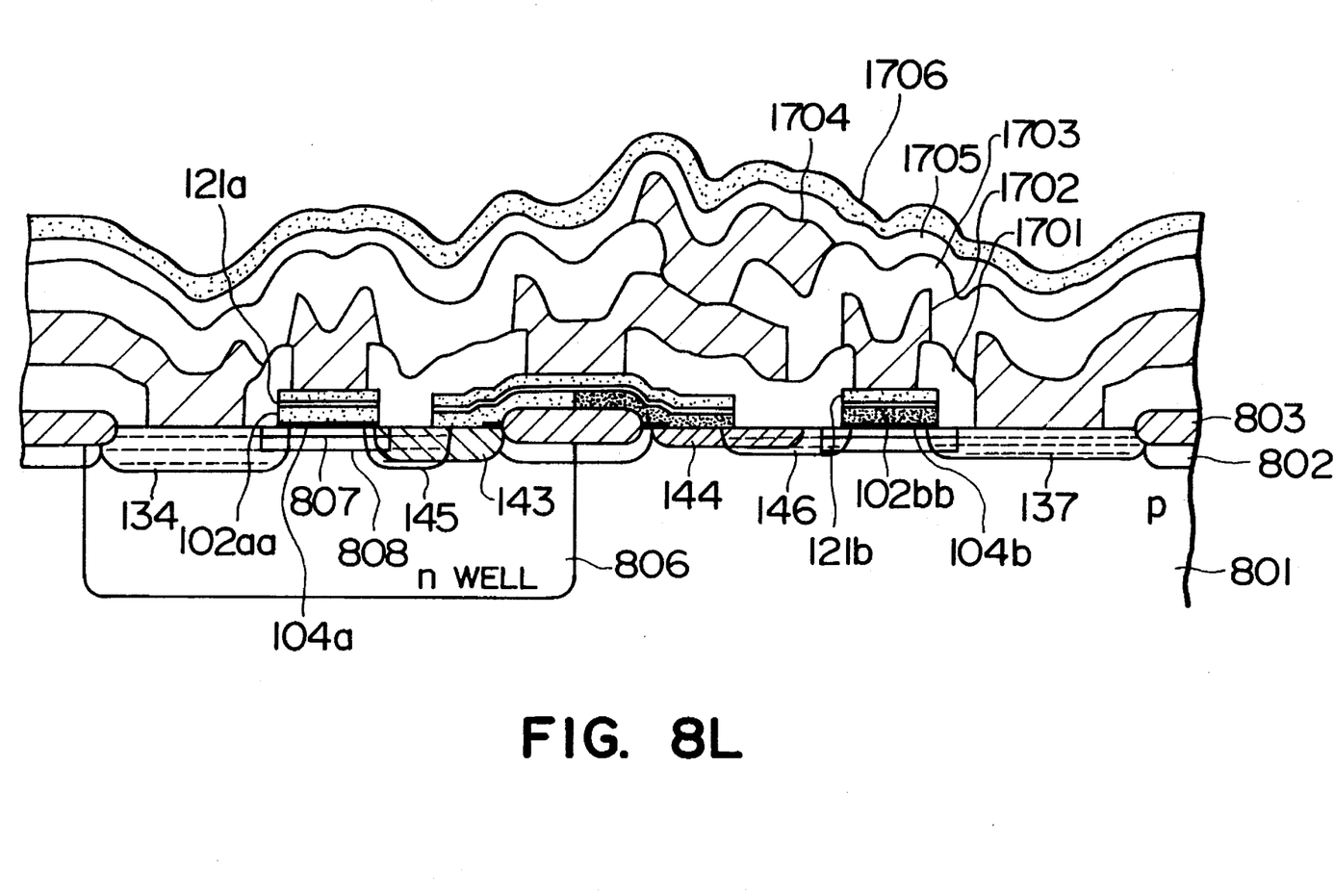

Subsequently, a first layer of wiring 1702 and an inter-layer isolation film 1701, and a second layer of wiring 1704 and an inter-layer isolation film 1703 are formed on the surface, then a passivation film 1706 is formed over the entire surface (FIG. 8L).

In the structure formed by the above method, boron ions are prevented by the amorphous film 103 from penetrating into the channel portion (the counter-dose region 105 and punch-through current suppression layer 106) below the polysilicon film 102, so the threshold voltage does not deviate from its initial value set at the design stage, and hence it can be controlled with a high degree of accuracy.

It should be noted that if the amorphous film 103 of FIG. 8B is made of a refractory metal such as tungsten, instead of a metal silicide, a suitable thermal processing temperature cycle in a heat furnace or a rapid thermal furnace could be employed to control the conversion of the metal into its silicide, optimizing residual stresses and reducing resistance. The amorphous film 103 could comprise a combination of several different materials, not just one, but the use of equipment that can form these materials sequentially or alternately in the same chamber by sputtering is preferable to reduce the time required for the manufacture. The use of an amorphous film formed by the above-described method can provide complementary MOS transistors that have gate electrodes of lower resistances and threshold voltages that are approximately the same as their design values.

The above-described embodiment is an example of the present invention, but should not be taken as limiting the present invention in any way. For example, an n-type impurity is implanted into the polysilicon film 102 on the n-channel MOS transistor side in the step shown in FIG. 8D, but this ion implantation could be replaced with batch implantation over the entire surface by a phosphorous trichlorate (POCl$_3$) doping method, or electrically active impurities could be added during an LPCVD method process when the amorphous film 103 is formed beforehand. In addition, the amorphous film 103 that is formed over the surface of the polysilicon film 111 in the step shown in FIG. 8B could also be formed by implanting arsenic ions into the polysilicon film 111 at a high dosage of, for example $5 \times 10^{16}$ atoms/cm$^2$ with an accelerating voltage of 30 keV. Since the quantity of arsenic ions is so high, they are implanted at a high concentration, making the surface of the polysilicon film 111 amorphous. As a result, the amorphous film 103 formed over the surface of the polysilicon film 111 will also serve to prevent the penetration of boron ions during the subsequent implantation thereof.

What is claimed is:

1. A method of manufacturing a CMOS semiconductor device comprising the steps of:

forming an n-type well in a part of a p-type semiconductor substrate;

forming a gate oxide film on the surface of the semiconductor substrate and on the n-type well, said gate oxide film having holes, exposing the semiconductor substrate, corresponding to a region where a drain of an n-channel transistor in the p-type semiconductor substrate is to be formed and to a region where a drain of a p-channel transistor in the n-type well is to be formed;

forming punch-through current suppression layers and counter-dose regions under regions where gates of the p-channel and n-channel transistors are to be formed;

depositing a polysilicon film on said gate oxide film and on the semiconductor surface exposed through said holes;

depositing an amorphous film on said polysilicon film, wherein said amorphous film is a refractory metal selectively forming a first resist film having a hole corresponding to said n-type well;

implanting boron ions through the amorphous film into said polysilicon film over the n-type well;

removing said first resist film;

selectively forming a second resist film having a hole corresponding to a region where said n-channel transistor is to be formed;

implanting n-type impurity ions into said polysilicon film within the region where said n-channel transistor is to be formed; and heat processing to diffuse boron and n-type impurity regions into said n-type well and p-type substrate, respectively, to form impurity diffusion regions at the portions where drains are to be formed.

2. A method of manufacturing a CMOS semiconductor device according to claim 1, comprising the further step of silicifying said amorphous film at the interface with the polysilicon film.

* * * * *